United States Patent
Huang et al.

(10) Patent No.: US 8,335,090 B2
(45) Date of Patent: Dec. 18, 2012

(54) LOW COST HIGH EFFICIENCY HIGH POWER SOLAR POWER CONVERSION SYSTEM CIRCUIT AND SOLAR POWER SUPPLY SYSTEM

(75) Inventors: Wei-Chi Huang, Jhongli (TW); Tsung-Liang Hung, Jhongli (TW); Yu-Hsiao Chao, Jhongli (TW); Chi-Hsiung Lee, Jhongli (TW)

(73) Assignee: Ampower Technology Co., Ltd., Jhongli, Taoyuan County (TW)

( * ) Notice: Subject to any disclaimer, the term of this patent is extended or adjusted under 35 U.S.C. 154(b) by 547 days.

(21) Appl. No.: 12/649,558

(22) Filed: Dec. 30, 2009

(65) Prior Publication Data
US 2011/0103114 A1   May 5, 2011

(30) Foreign Application Priority Data
Oct. 30, 2009   (CN) .......................... 2009 2 0313733

(51) Int. Cl.
*H02M 3/335* (2006.01)
(52) U.S. Cl. ............. 363/17; 323/266; 323/906; 363/98
(58) Field of Classification Search .................. 323/222, 323/266, 299, 906; 363/17, 98
See application file for complete search history.

(56) References Cited

U.S. PATENT DOCUMENTS

| | | | | |
|---|---|---|---|---|
| 5,869,956 | A * | 2/1999 | Nagao et al. ................... | 323/299 |
| 6,493,246 | B2 * | 12/2002 | Suzui et al. ..................... | 363/95 |
| 7,994,768 | B2 * | 8/2011 | Park .............................. | 323/283 |
| 2008/0278983 | A1 * | 11/2008 | Park .............................. | 363/95 |
| 2011/0103114 | A1 * | 5/2011 | Huang et al. .................. | 363/131 |
| 2011/0134668 | A1 * | 6/2011 | Cho ............................... | 363/78 |
| 2012/0042588 | A1 * | 2/2012 | Erickson, Jr. ................ | 52/173.3 |
| 2012/0069602 | A1 * | 3/2012 | Escobar et al. ................ | 363/13 |
| 2012/0081937 | A1 * | 4/2012 | Phadke .......................... | 363/95 |
| 2012/0170325 | A1 * | 7/2012 | Jin et al. ..................... | 363/21.09 |
| 2012/0188795 | A1 * | 7/2012 | Deng .............................. | 363/17 |
| 2012/0212985 | A1 * | 8/2012 | Lee et al. ........................ | 363/98 |

* cited by examiner

*Primary Examiner* — Jeffrey Sterrett
(74) *Attorney, Agent, or Firm* — Altis Law Group, Inc.

(57) ABSTRACT

A solar power supply system includes at least one solar power conversion circuit and an inverter circuit. Each solar power conversion circuit comprises a solar module and a direct current (DC) module. The solar module converts the solar power into the DC signals. The DC module with two-stage conversion comprises a DC transformer circuit and a maximum power point tracking circuit, to boost the DC signals and adjust output power of the solar module to a maximum value. The inverter circuit converts the boosted DC signals output from the solar power conversion circuits into AC signals and combines the AC signals into the AC utility network.

13 Claims, 4 Drawing Sheets

US 8,335,090 B2

LOW COST HIGH EFFICIENCY HIGH POWER SOLAR POWER CONVERSION SYSTEM CIRCUIT AND SOLAR POWER SUPPLY SYSTEM

BACKGROUND

1. Technical Field

The present disclosure relates to a solar power conversion circuit and a power supply system using the same.

2. Description of Related Art

Solar energy is an increasingly popular alternative to fossil fuel-based energy source. Solar energy is utilized to generate electrical energy, where sunlight is absorbed by a photovoltaic module and converted into alternating current (AC) signals.

FIG. 4 shows a commonly used power supply system that utilizes solar energy. A photovoltaic module 100, comprising a plurality of solar cells, receives the sunlight and converts it into direct current (DC) signals. An AC module 200 is a DC/AC conversion circuit, to convert the DC signals into the AC signals of 220V. The AC signals are combined into an AC network 300. In addition, the AC module 200 with a maximum power point tracking (MPPT) function can track a maximum power point of the PV module 100.

It should be understood that each photovoltaic module 100 needs one AC module 200, thus, the power supply system of FIG. 4 is only suitable relatively low power requirements. When high power is required, a plurality of the PV modules 100 and a plurality of AC modules must be deployed accordingly, which has high costs. Additionally, because the AC module 200 has both MPPT and boost conversion functions, the photovoltaic module 100 cannot function accurately at the maximum power point. Furthermore, the AC module 200 as a single stage conversion circuit to convert DC signals output from the photovoltaic module 100 into AC signals directly, exhibits only limited efficiency.

DETAILED DESCRIPTION

Figure 1:
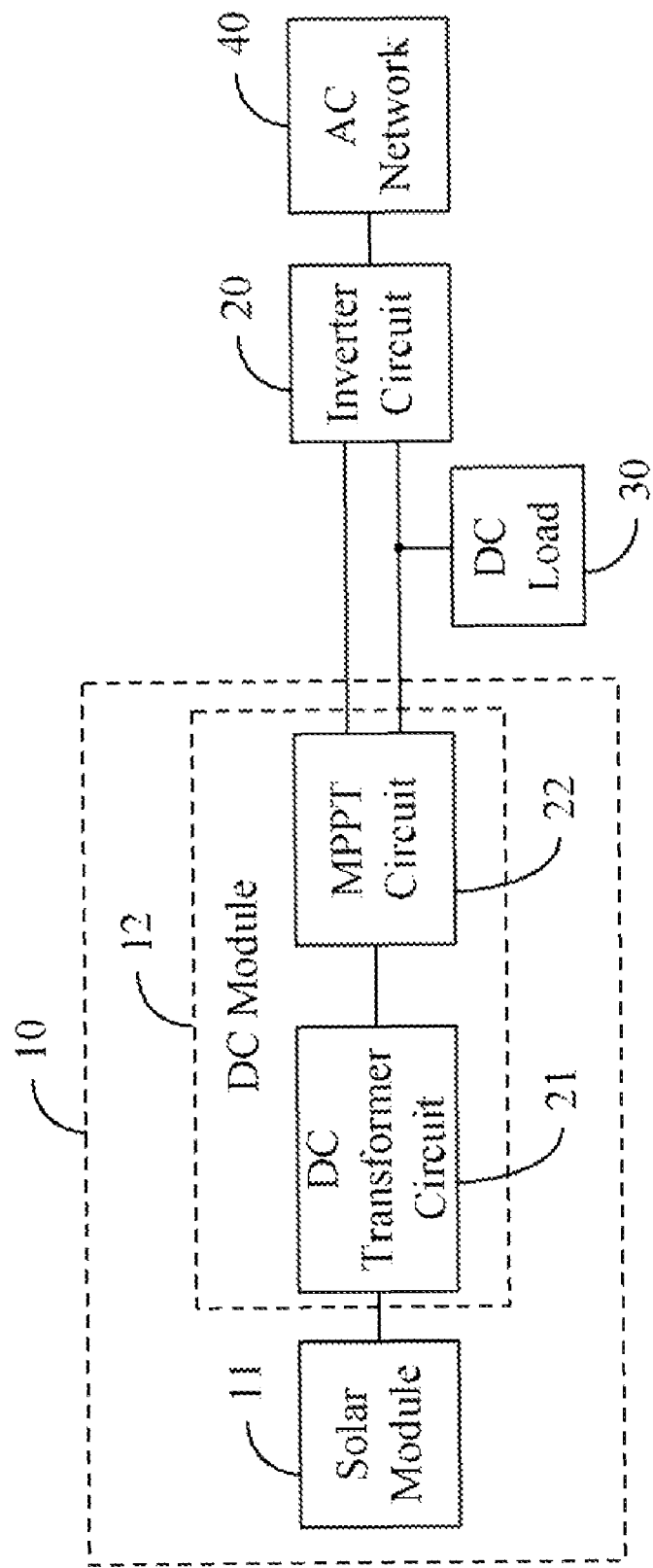
FIG. 1 is a block diagram of a first embodiment of a solar power supply system.

FIG. 1 is a block diagram of a first embodiment of a solar power supply system, which converts solar power (e.g. sunlight) into electrical energy used in a direct current (DC) load 30 or an alternating current (AC) network 40. The solar power supply system comprises a solar power conversion circuit 10 and an inverter circuit 20.

The solar power conversion circuit 10 comprises a solar module 11 and a DC module 12. In one embodiment, the solar module 11 comprises a plurality of solar cells connected in series or in parallel selectively, to convert the solar power into DC signals. The DC module 12 as a two-stage conversion circuit boosts the DC signals output from the solar module 11 with a maximum power. The DC module 12 comprises a DC transformer circuit 21 and a maximum power point tracking (MPPT) circuit 22. The inverter circuit 20 converts the boosted DC signals into AC signals combined into the AC network 40.

In one embodiment, voltage of the DC signals output from the solar power conversion circuit 10 is about 400V. The DC load 30 can be connected to an output of the solar power conversion circuit 10 directly or via an adapter (not shown).

In the embodiment, main functions of the DC transformer circuit 21 and the MPPT circuit 22 consist of boosting the DC signals and tracking a maximum output power of the solar module 11 respectively, both of which are connected to the solar module 11 in sequence. In alternative embodiments, connection of the DC transformer circuit 21 and the MPPT module 22 can be exchanged.

Figure 2:
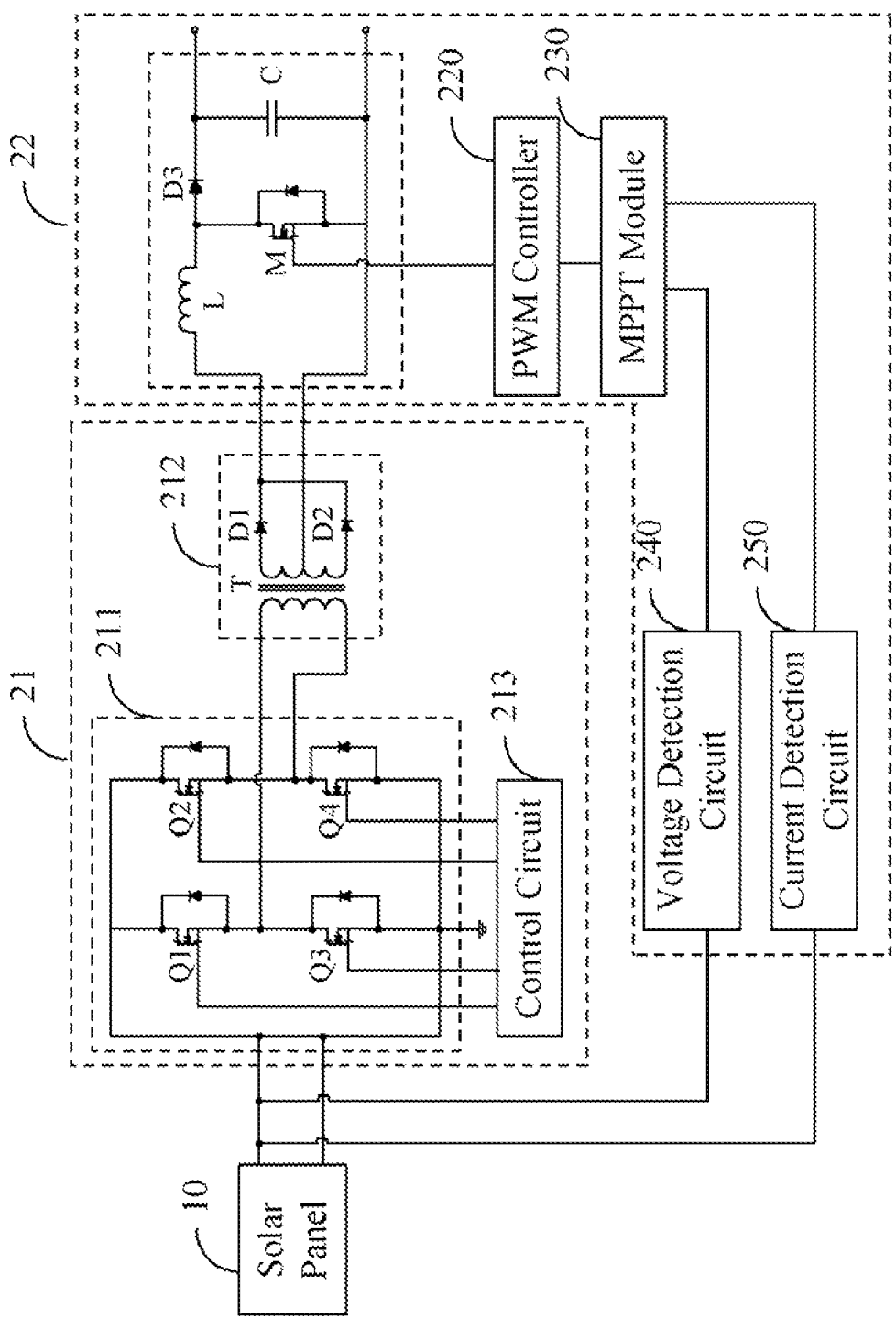
FIG. 2 is a detailed circuit diagram of one embodiment a direct current (DC) module of FIG. 1.

FIG. 2 is a detailed circuit diagram of one embodiment of the DC module 12 of FIG. 1. The DC transformer circuit 21 comprises a bridge circuit 211, a transformer circuit 212 and a control circuit 213. In one embodiment, the bridge circuit 211 is a full-bridge circuit to convert the DC signals output from the solar module 11 into square-wave signals. In another embodiment, the bridge circuit 211 can be a half-bridge circuit, or a push-pull circuit, for example.

The transformer circuit 212 boosts the square-wave signals (e.g., the square-wave signals) output from the bridge circuit 211 for a first time and converts the square-wave signals into another DC signals, which comprises a transformer T and two diodes D1, D2. A primary winding of the transformer T is connected to the bridge circuit 211. Anodes of the diodes D1, D2 are connected to a high voltage end and a low voltage end of a secondary winding of the transformer T respectively, and cathodes thereof are connected together, to rectify and filter the boosted square-wave signals output from the transformer T into the another DC signals.

The control circuit 213 is connected to the bridge circuit 211, to limit a duty cycle of the bridge circuit 211 to a predetermined value.

The MPPT circuit 22 comprises a DC conversion circuit 221, a pulse width modulation (PWM) controller 222, a MPPT module 223, a voltage detection circuit 224 and a current detection circuit 225. In one embodiment, the DC conversion circuit 221 may be a typical boost circuit connected to the transformer circuit 212, to step the DC signals output from the transformer circuit 212 for a second time. The DC conversion circuit 221 comprises an inductor L, a diode D3, a transistor M, and a capacitor C. An anode of the diode D3 is connected to the high voltage end of the secondary winding of the transformer T via the inductor L. The transistor M is a metallic oxide semiconductor field effect transistor (MOSFET), which is connected to the capacitor C in parallel and connected between two outputs of the MPPT circuit 22, with a control end thereof connected to the PWM controller 222. A cathode of the diode D3 is connected to one end of the capacitor C.

Both the voltage detection circuit 224 and the current detection circuit 225 are connected to the solar module 11, to detect voltage and current of the solar module 11 and output to the MPPT module 223. The MPPT module 223 is connected to the voltage detection circuit 224 and the current detection circuit 225, to calculate output power of the solar module 11 according to the detected voltage and current of the solar module 11. The PWM controller 222 is connected between the MPPT module 223 and the DC conversion circuit 221, to change a duty cycle of the transistor M according to the calculated output power, in order to adjust the output power of the solar module 11 to the maximum value and make the DC signals output from the DC module 12 to meet a requirement of a load at the same time.

The voltage detection circuit 224, the current detection circuit 225, the MPPT module 223 and the PWM controller 222 are all commonly used circuits, and description thereof is omitted.

Figure 3:
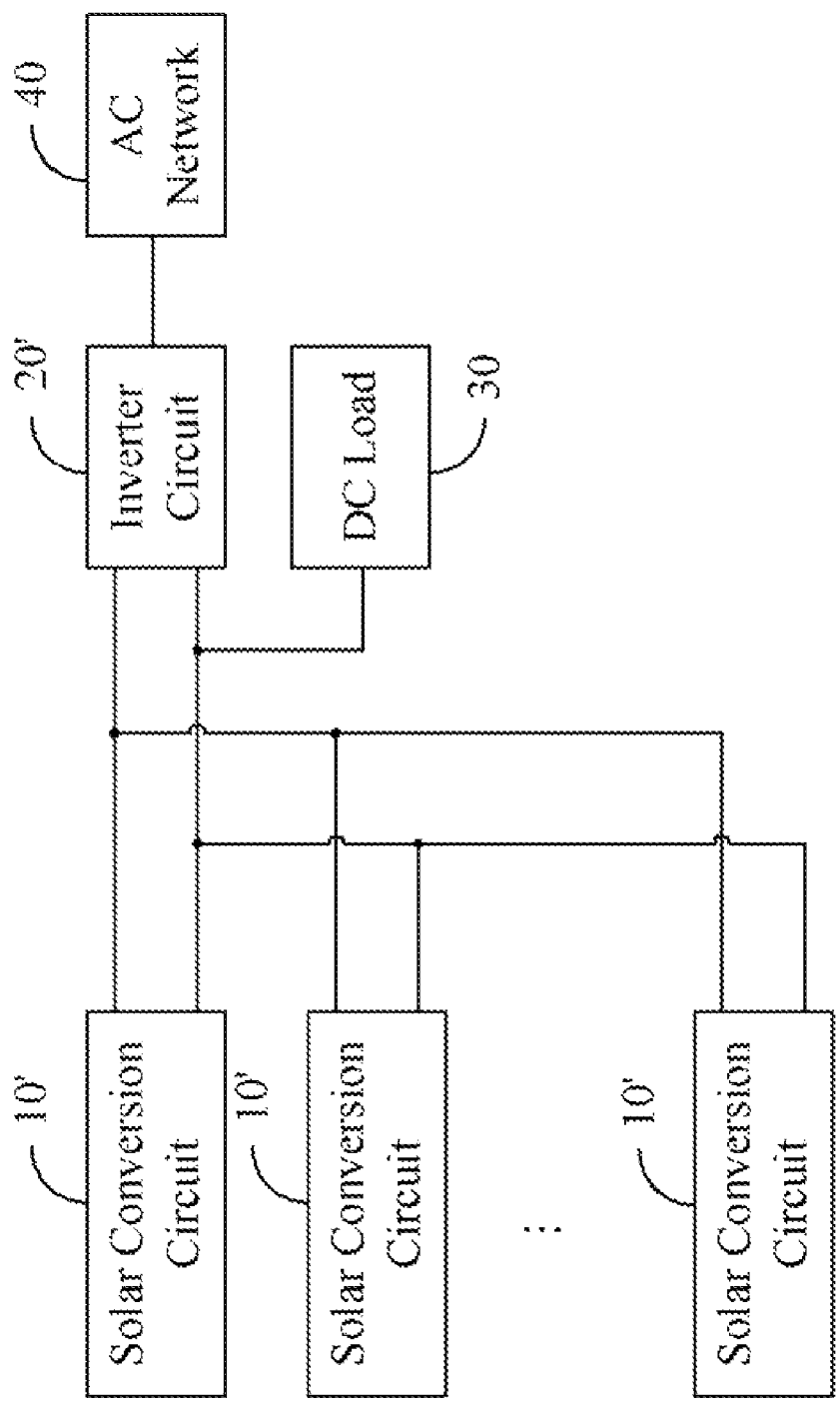
FIG. 3 is a block diagram of a second embodiment of a solar power supply system.
Figure 4:
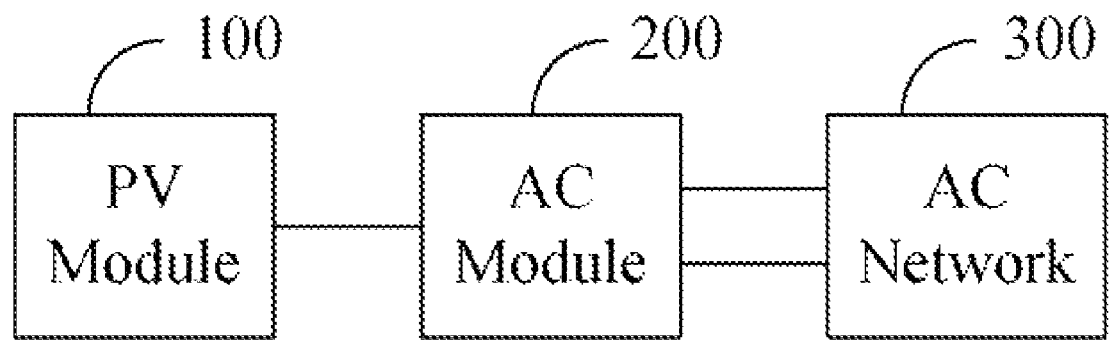
FIG. 4 is a commonly used solar power supply system.

FIG. 3 is a block diagram of a second embodiment of a solar power supply system comprising a plurality of solar power conversion circuits 10' connected in parallel and also to the DC load 30 or to the AC network 40 via an inverter circuit 20'. Structure of the solar power conversion circuit 10' in this embodiment is substantially the same as that of the previous embodiment, and thus description thereof is not included here.

In the present disclosure, each solar power conversion circuit comprises a DC module to boost DC signals output from a solar module increasing conversion efficiency; in addition, a MPPT function can be independent of a boost function, thus, the solar module can function at a maximum output power point; with a plurality of solar power conversion circuits using only one inverter circuit, which has a reduced cost.

Although the features and elements of the present disclosure are described in various inventive embodiment in particular combinations, each feature or element can be configured alone or in various within the principles of the present disclosure to the full extent indicated by the broad general meaning of the terms in which the appended claims are expressed.

What is claimed is:

1. A solar power conversion circuit, comprising:
    a solar module to convert solar power into direct current (DC) signals; and
    a DC module with two-stage conversion, comprising:
        a DC transformer circuit to boost the DC signals for a first time; and
        a maximum power point tracking (MPPT) circuit to boost the DC signals for a second time and output the boosted DC signals with a maximum power.

2. The solar power conversion circuit as claimed in claim 1, wherein the DC transformer circuit comprises:
    a bridge circuit to convert the DC signals into square-wave signals;
    a transformer circuit to boost the square-wave signals for the first time and convert the square-wave signals into another DC signals; and
    a control circuit to limit a duty cycle of the bridge circuit to a predetermined value.

3. The solar power conversion circuit as claimed in claim 2, wherein the bridge circuit comprises a full-bridge circuit, a half-bridge circuit, or a push-pull circuit.

4. The solar power conversion circuit as claimed in claim 2, wherein the MPPT circuit comprises:
    DC conversion circuit connected to the transformer circuit, to boost the DC signals output from the transformer circuit for the second time;
    a voltage detection circuit connected to the solar module, to detect voltage of the solar module;
    a current detection circuit connected to the solar module, to detect current of the solar module;
    a MPPT module connected to the voltage detection circuit and the current detection circuit, to calculate a output power of the solar module according to the detected voltage and current; and
    a pulse width modulation (PWM) controller connected between the MPPT module and the DC conversion circuit, to control the DC conversion circuit to adjust the output power of the solar module to the maximum value according to the calculated output power.

5. The solar power conversion circuit as claimed in claim 4, wherein the DC conversion circuit comprises a DC boost conversion circuit.

6. The solar power conversion circuit as claimed in claim 5, wherein the DC boost conversion circuit comprises:
    a transistor having a control end connected to the PWM controller, to utilize the PWM controller to change a duty cycle thereof; and
    a capacitor connected to the transistor in parallel, to filter the boosted DC voltage signals output from the DC conversion circuit.

7. A solar power supply system to convert solar power into electrical energy, comprising:
    at least one solar power conversion circuit to convert solar power into electrical signals, comprising:
        a solar module to convert the solar power into direct current (DC) signals; and
        a DC module with two-stage conversion, comprising:
            a DC transformer circuit to boost the DC signals for a first time; and
            a maximum power point tracking (MPPT) circuit to boost the DC signals for a second time with a maximum power; and
    an inverter circuit to convert the DC signals output from the solar power conversion circuits into AC signals and combine the AC signals into an AC network.

8. The solar power supply system as claimed in claim 7, wherein the solar power conversion circuits are connected between each other in parallel.

9. The solar power supply system as claimed in claim 7, wherein the DC transformer circuit comprises:
    a bridge circuit to convert the DC signals into square-wave signals;
    a transformer circuit to boost the square-wave signals for the first time and convert the square-wave signals into another DC signals; and
    a control circuit to limit a duty cycle of the bridge circuit to a fixed value.

10. The solar power supply system as claimed in claim 9, wherein the bridge circuit comprises a full-bridge circuit, a half-bridge circuit, or a push-pull circuit.

11. The solar power supply system as claimed in claim 9, wherein the MPPT circuit comprises:
    a DC conversion circuit connected to the transformer circuit, to boost the DC signals output from the transformer circuit for the second time;
    a voltage detection circuit connected to the solar module, to detect voltage of the solar module;
    a current detection circuit connected to the solar module, to detect current of the solar module;
    a MPPT module connected to the voltage detection circuit and the current detection circuit, to calculate a output power of the solar module according to the detected voltage and current; and
    a pulse width modulation (PWM) controller connected between the MPPT module and the DC conversion circuit, to direct the DC conversion circuit to adjust the output power of the solar module to the maximum value according to the calculated output power.

12. The solar power supply system as claimed in claim 11, wherein the DC conversion circuit comprises a DC boost conversion circuit.

13. The solar power supply system as claimed in claim 12, wherein the DC boost conversion circuit comprises:
    a transistor comprising a control end connected to the PWM controller, to utilize the PWM controller to change a duty cycle thereof; and
    a capacitor connected to the transistor in parallel, to filter the boosted DC voltage signals output from the DC conversion circuit.

* * * * *

UNITED STATES PATENT AND TRADEMARK OFFICE
CERTIFICATE OF CORRECTION

PATENT NO. : 8,335,090 B2
APPLICATION NO. : 12/649558
DATED : December 18, 2012
INVENTOR(S) : Wei-Chi Huang et al.

It is certified that error appears in the above-identified patent and that said Letters Patent is hereby corrected as shown below:

On the Title Page, Item (54) and in the Specification, Column 1, Title should read:

-- LOW COST HIGH EFFICIENCY HIGH POWER SOLAR POWER CONVERSION CIRCUIT AND SOLAR POWER SUPPLY SYSTEM --

Signed and Sealed this
Fifteenth Day of October, 2013

Teresa Stanek Rea
*Deputy Director of the United States Patent and Trademark Office*